United States Patent [19]
Kjebon

[11] Patent Number: 5,498,968
[45] Date of Patent: Mar. 12, 1996

[54] METHOD AND A DEVICE TO MEASURE ELECTROMAGNETIC RADIATION FROM OR RECEPTION OF FROM OUTSIDE COMING ELECTROMAGNETIC RADIATION IN A CIRCUIT CARD

[75] Inventor: Fredrik E. Kjebon, Stockholm, Sweden

[73] Assignee: Telefonaktiebolaget LM Ericsson, Stockholm, Sweden

[21] Appl. No.: 244,852

[22] PCT Filed: Oct. 26, 1993

[86] PCT No.: PCT/SE93/00876

§ 371 Date: Aug. 16, 1994

§ 102(e) Date: Aug. 16, 1994

[87] PCT Pub. No.: WO94/10825

PCT Pub. Date: May 11, 1994

[30] Foreign Application Priority Data

Oct. 27, 1992 [SE] Sweden .................................. 9203145

[51] Int. Cl.⁶ .................................................. G01R 27/28
[52] U.S. Cl. .............................................. 324/627; 324/95
[58] Field of Search ............................... 324/750, 95, 627

[56] References Cited

U.S. PATENT DOCUMENTS

| | | |
|---|---|---|
| 2,509,045 | 5/1950 | Salisbury . |
| 4,463,309 | 7/1984 | Crochet et al. ................ 324/627 |
| 4,939,446 | 7/1990 | Rogers ........................... 324/750 |
| 5,006,788 | 4/1991 | Goulette et al. ................ 324/750 |

FOREIGN PATENT DOCUMENTS

| | | |
|---|---|---|
| 239251 | 9/1987 | European Pat. Off. . |
| 0239251 | 9/1987 | European Pat. Off. . |
| 61-187672 | 8/1986 | Japan ........................ 324/750 |
| 1045430 | 9/1983 | U.S.S.R. . |

OTHER PUBLICATIONS

G. F. Eminger, "Circuit Pack Adaptor for High–Speed Circuit Packs," AT&T Technologies Technical Digest, No. 73, pp. 7–8 (Jan. 1984).
Derwent's Abstracts Nr. 84–157 004/25, SU 1 045 430.

Primary Examiner—Maura K. Regan
Attorney, Agent, or Firm—Burns, Doane, Swecker & Mathis

[57] ABSTRACT

In order to measure radiation emitted from or the influence of radiation on an individual circuit board, which in use normally is arranged in a rack in parallel to other circuit boards, all circuit boards being connected to a common backplane, the backplane is modified in such a way that the connection of a considered board will be located on the opposite side of said backplane compared to the connections of the others boards. The whole equipment is located in a shielded housing except the considered circuit board. Thus the radiation from the other circuit boards will be shielded or attenuated and only the radiation from the considered circuit board will contribute to the radiation field around the device. In the same way only this considered circuit board will be sensitive to electromagnetic radiation arriving from the outside. The power supply of the device is preferably provided by power equipment located inside the shielded housing, such as a battery as well as a direct voltage power adaption unit.

20 Claims, 1 Drawing Sheet

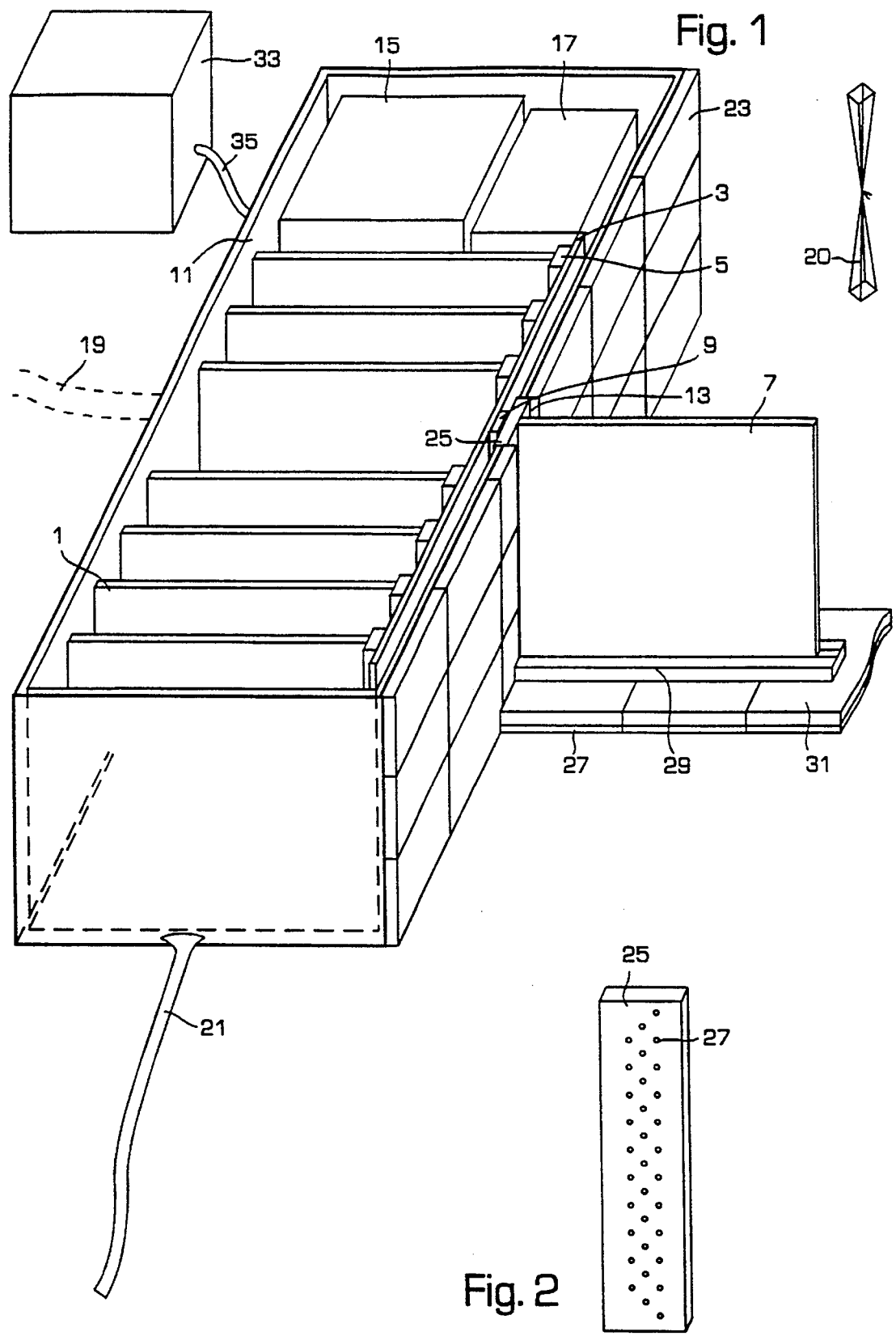

METHOD AND A DEVICE TO MEASURE ELECTROMAGNETIC RADIATION FROM OR RECEPTION OF FROM OUTSIDE COMING ELECTROMAGNETIC RADIATION IN A CIRCUIT CARD

BACKGROUND

The present invention relates to measuring electromagnetic emission from component or circuit boards mounted in racks, i.e. in the usual way in parallel to each other with a common connection plane, on one side of which the connections to the boards are located. The invention also relates to measuring interference sensitivity to electromagnetic radiation coming from the outside in such an individual component or circuit board, i.e. the influence of the radiation on the signal transmission between the electronic circuits on the board and therefrom to the connections of the board in the connection plane.

Authorities in different countries make ever harder demands on the amount of electromagnetic radiation which is allowed to be emitted by electronic equipment. Emission of electromagnetic radiation thus must be restricted as much as possible. For electronic equipment, in which several component or circuit boards are mounted in parallel in a common connection plane, there is for natural reasons particular difficulties in measuring the emitted radiation from each individual board.

From the document AT & T Technologies, Technical Digest No. 73, January 1984, "Circuit Pack Adaptor for High-Speed Circuit Packs", it is, in the testing of electronic equipment previously known to mount an individual circuit board on the rear side of the backplane or connection plane conventionally used in a computer. This mounting of the individual board makes the conductors on the board accessible for connection to electric testing equipment. The device mentioned in this document can however not be used for the measurement of the electromagnetic radiation which is emitted from the circuit board connected at the rear side, since radiation emitted from this card is mixed with the radiation emitted from the other boards. Nor is this device suited to be used for testing the interference sensitivity of an individual board, since a possible fault appearing in the electronic device, as a whole, of which an individual board is a part, not securely can be traced to have appeared in this board.

SUMMARY

For measuring the emission from and radiation effects on an individual board a method and a device are provided, the more detailed characteristics of which appear below.

Thus a backplane or connection plane is used being principally of the kind disclosed in the document cited above. In addition however, all other component or circuit boards than that to be tested, are enclosed by suitable electrical and/or magnetic shieldings. Hereby the measurement is not disturbed by radiation emitted from the other component or circuit boards. Nor will faults appear in the shielded boards except possibly in the board which is tested and which protrudes from the rear side of the connection plane. The board which is tested then suitably protrudes through a slot in the shielding, which in the simplest embodiment is an electrically conducting, grounded housing.

On one side of this housing, which is located adjacent to the board which is tested, ferrite material may be arranged to provide also a magnetic shielding. Also the slit area itself, through which the board protrudes from the housing, can be covered by a ferrite plate. It is then provided with appropriate openings for connection pins or connection leads to the component or circuit board which is to be tested.

For some boards also advantageously a lower and/or an upper ground plane may be arranged, which are located in an angle perpendicular to the surface of the board. This or these extra ground planes are further advantageously also coated by ferrite material on the side facing the tested board.

Further the device should in the testing operation be operated by a battery power source, possibly supplemented by an appropriate voltage converting assembly for production of various suitable supply voltages.

BRIEF DESCRIPTION OF THE DRAWING

The invention will now be described with reference to the accompanying drawings, in which FIG. 1 shows a perspective view of a device for the measurement of emission from and the influence of incoming radiation on an individual board, where the lid is removed for the sake of visibility, and FIG. 2 shows a shielding plate for use in interference suppression of the connection slit for a board.

DESCRIPTION DESCRIPTION

An electronic equipment comprises in the common way several component or circuit boards. The boards are mounted in the cabinet or in a rack and are all electrically connected to the same side of a common backplane or connection plane. The backplane is in the usual way constituted by a circuit board with suitable connection plugs or sockets for the individual component or circuit boards.

In FIG. 1 is shown, in a perspective view, how the electronic equipment is modified for testing an individual board. When a person thus wants to measure the electromagnetic emission from an individual component or circuit board 7, the person produced a backplane 3, which has the same configuration as the backplane used in the ordinary operation of the original electronic equipment but with the exception that the connection, i.e. the socket 9, for the circuit board 7, which is to be tested, is located on the opposite side of the backplane 3, compared to the other connections 5 for the other component or circuit boards 1. It means, that the connections of the individual conductors on the board to the socket 9 will be located in such a way that they correspond to a mirrored image with reference to the centre of the socket of the original connections for a corresponding circuit board which is not displaced.

The backplane 3 configured in this way is then equivalent in the operation to the original backplane and the electronic equipment constructed with a modified backplane is naturally also equivalent to the original electronic equipment, provided that the other components in electronic equipment are unchanged.

The backplane 3 is placed with its connected component and circuit boards 1 and 7 in a shielded housing 11 together with other suitable components in the electronic equipment. The housing 11 consists, as is shown in the Figure, of a rectangular housing with a bottom, sides and a lid (the lid is not shown in the figure). The lid is provided with an opening 13, through which the circuit board 7, which is to be tested, protrudes. Further, the power supply for the electronic equipment is arranged in the shielded housing 11, such as indicated with the battery 15 and an assembly 17 for obtaining appropriate direct voltages based on the direct voltage of the battery 15.

Alternatively the equipment may be supplied by means of an exterior connection 19, in the figure drawn with dotted lines, in that case the assembly 17 being a conventional direct voltage power unit. The connection line 19, when it is connected to an exterior voltage source, must be very well shielded.

In a measurement the device is started and then also the lid not shown in FIG. 1 is mounted on the shielded housing 11. For measurement of emission further the electronic equipment as a whole is installed on a place which is free from extra electromagnetic fields, such in a free field measuring place or in an electromagnetically attenuated room coated by attenuating plates or with attenuating cones. A receiver antenna, schematically indicated at 20, is placed on different positions in the neighbourhood of the electronic equipment and is connected to an analysis equipment (not shown), whereby an emission field can be determined or for instance only the maximum direction of the emitted electromagnetic radiation.

The shielded housing 11 is further grounded by means of a ground cable 21 and in order to further improve the shielding of radiation, originating from the interior of the shielded housing 11, one side of the shielded housing may be coated with ferrite plates 23. It is made preferably only on the side of the housing 11, which has the opening 13 for the board 7 which is to be tested. Also the shielding of the opening 13 in this side can be improved by placing a ferrite plate 25 in the opening. The ferrite plate is, as is shown in FIG. 2, provided with a number of holes 27, through which the connections in the shape of for instance pins from the board 7 or alternatively from the socket 9 extend.

Boards having frontal connections and a special grounding can for shielding purposes require a supplement in the shape of an extra ground plane 27 carrying a board guide 29, e.g. as normally made of plastics material. Advantageously the ground plane 27 is coated by ferrite plates 31. The ground plane 27 protrudes from the shielded housing 11 and is arranged in an angle perpendicular to the board 7 which is to be tested. Such ground planes 27 can be arranged both at the lower and the upper edge of the board if required. Suitable board guides similar to the one indicated at 29 are in addition also advantageously used, when extra ground planes 27 are not used.

In certain cases the ferrite plates, both at the rear side and on the extra ground planes, can, for enhancing the attenuation for very high frequencies, by supplemented by cones of attenuating material (not shown).

Above the invention has been described for the case of measuring the emission from an individual component board. When the resistance of the electronic equipment to electric interferences or disturbances instead is to be tested, the equipment is like above started and suitable electromagnetic external waves are generated by means of some appropriated sender antenna, like the one indicated at 20. The emission field of the antenna should then be known. In operation of electronic equipment and when varying the radiation field, the power and frequency and direction thereof, it is detected in the electronic equipment whether any disturbances of the operation appear. Therefore suitably an exterior analysis equipment 33 is arranged, having another, very well shielded connection 35 to the electronic circuits in the shielded housing 11.

What is claimed is:

1. A method of facilitating measurement of electromagnetic emission from or reception of electromagnetic radiation by an individual circuit board in an electronic device to be tested, wherein the individual circuit board is arranged in parallel to other circuit boards, and the boards all have electric connections arranged at the same side of a backplane common to the boards, comprising the steps of:

producing a connection to a backplane which is electrically equivalent to a backplane normally used in the electronic device to be tested, with the exception that the produced connection which is to be used for the individual circuit board is located on a side of the produced backplane which is opposite to a side where all other connections to the other circuit boards are located;

placing all circuit boards in their connections in the produced backplane, whereby an electronic device is obtained, which in the functioning thereof is equivalent to the electronic device to be tested;

arranging an electric shielding around the other circuit boards in the obtained electronic device except the individual circuit board to be tested; and starting the obtained electronic device modified in this way and measuring electromagnetic emission from or reception of electromagnetic radiation coming from outside the electronic device.

2. A method according to claim 1, wherein at least partly a magnetic shielding is arranged as a supplement to the electric shielding.

3. A method according to claim 1, wherein the shielding comprises an electrically conducting housing connected to ground.

4. A method according to claim 3, wherein the conductive housing has a side which is located adjacent to the produced backplane, and that this side is covered by a ferrite material.

5. A method according to claim 1, wherein the electric shielding is provided with a slit shaped opening, through which the individual component or circuit board extends.

6. A method according to claim 5, wherein the slit shaped opening is provided with a coating of ferrite material, in which holes are made, for passing electric connection leads to the individual component or circuit board.

7. A method according to claim 1, wherein an electrically shielding plane is arranged at a lower edge and/or an upper edge of the individual component or circuit board and perpendicularly to the board.

8. A method according to claim 7, wherein the electrically conducting shielding plane is connected to ground.

9. A method according to claim 7, wherein the electrically conducting shielding plane is covered by a ferrite material.

10. A method according to claim 3, wherein the electronic device is started by connecting it to a battery power source located in the shielded housing.

11. A device for facilitating measurement of electromagnetic emission from or reception of electromagnetic radiation by an individual component board in an electronic device to be tested, wherein the individual component board is arranged in parallel to other component boards, and the boards all have electric connections arranged at the same side of a connection plane common to the boards, and when measuring the electromagnetic emission, an electronic device is obtained, which in the functioning thereof is equivalent to the electronic device to be tested, is intended to be used together with a means for measuring electromagnetic radiation, the obtained device comprising a connection plane, which is similar to the connection plane used in the electronic device to be tested, with the exception that a produced connection, belonging to the individual component board, is located on a side of the produced connection plane which is opposite to a side where all other connections to the other component boards are located;

wherein all component boards are placed in their connections in the produced connection plane of the obtained electronic device and the obtained electronic device in addition comprises all the components included in the electronic device to be tested, and an electric shielding arranged around the other component boards except the individual component board, wherein the obtained device, when used for measuring the reception of electromagnetic radiation coming from outside the measuring device, comprises means for measuring this reception.

12. A device according to claim 11, wherein at least partly the electric shielding is supplemented by a magnetic shielding.

13. A device according to claim 11, wherein the shielding comprises an electrically conducting housing connected to ground.

14. A device according to claim 11, wherein the conductive housing comprises a side located adjacent to the backplane of the measuring device and that this side is covered by a magnetic shielding such as made of ferrite material.

15. A device according to claim 11, wherein the electric shielding is provided with a slit shaped opening, through which the individual component or circuit board extends.

16. A device according to claim 15, wherein the slit shaped opening is provided with a coating of a magnetically shielding material such as ferrite material, in which holes are made, for passing electric connection leads to the individual component or circuit board.

17. A device according to claim 11, wherein an electrically conductive shielding plane is arranged at a lower edge and/or an upper edge of the individual component or circuit board.

18. A device according to claim 17, wherein the electrically conductive shielding plane is connected to ground.

19. A device according to claim 17, wherein the electrically conductive shielding plane is covered by a magnetically shielding material such as ferrite material.

20. A device according to claim 11, wherein the measuring device comprises a connection to a battery power source and that the connection and the power source are located inside the electric shielding.

* * * * *